(12) United States Patent
Ko

(10) Patent No.: US 10,153,160 B2
(45) Date of Patent: Dec. 11, 2018

(54) METHOD OF MANUFACTURING SEMICONDUCTOR DEVICE

(71) Applicant: SK hynix Inc., Icheon-si Gyeonggi-do (KR)

(72) Inventor: Min Sung Ko, Gwangju-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/623,000

(22) Filed: Jun. 14, 2017

(65) Prior Publication Data

US 2017/0287711 A1    Oct. 5, 2017

Related U.S. Application Data

(62) Division of application No. 15/089,642, filed on Apr. 4, 2016, now Pat. No. 9,711,355.

(30) Foreign Application Priority Data

Nov. 9, 2015 (KR) .......................... 10-2015-0156906

(51) Int. Cl.
H01L 21/768    (2006.01)
H01L 21/02     (2006.01)
H01L 27/1157   (2017.01)
H01L 27/11582  (2017.01)
H01L 21/324    (2006.01)
H01L 49/02     (2006.01)

(52) U.S. Cl.
CPC .. *H01L 21/02675* (2013.01); *H01L 21/02532* (2013.01); *H01L 21/02595* (2013.01); *H01L 21/324* (2013.01); *H01L 21/76877* (2013.01); *H01L 27/1157* (2013.01); *H01L 27/11582* (2013.01); *H01L 28/00* (2013.01)

(58) Field of Classification Search
CPC ......... H01L 21/02296; H01L 21/02365; H01L 21/70; H01L 21/702; H01L 21/71
See application file for complete search history.

(56) References Cited

U.S. PATENT DOCUMENTS

2013/0288438 A1* 10/2013 Jensen .................. H01L 21/268
                                                            438/197
2016/0133630 A1*  5/2016 Kim .................... H01L 27/1052
                                                            438/631

FOREIGN PATENT DOCUMENTS

KR    1020120019655 A    3/2012
KR    1020140037455 A    3/2014

* cited by examiner

*Primary Examiner* — Cheung Lee
(74) *Attorney, Agent, or Firm* — William Park & Associates Ltd.

(57) ABSTRACT

In accordance with an embodiment of the present disclosure, a method of manufacturing a semiconductor device may include forming an opening passing-through a multi-layer stack, forming a channel layer on and along a sidewall of the opening, forming a conductive layer on and along a sidewall of the channel layer, and applying a laser to the conductive layer to transfer a heat from the conductive layer to the channel layer to heat-treat the channel layer using the heat.

18 Claims, 7 Drawing Sheets

METHOD OF MANUFACTURING SEMICONDUCTOR DEVICE

CROSS-REFERENCE TO RELATED APPLICATION

The present application is a divisional application of U.S. application Ser. No. 15/089,642, filed on Apr. 4, 2016, and claims a priority under 35 U.S.C. § 119(a) to a Korean patent application number 10-2015-0156906 filed on Nov. 9, 2015, in the Korean Intellectual Property Office, the entire disclosure of which is incorporated herein by reference.

BACKGROUND

1. Technical Field

The present disclosure generally relates to a method of manufacturing an electronic device, and more particularly to a method of manufacturing a three-dimensional semiconductor device.

2. Related Art

A non-volatile memory device may retain its data even in the absence of a power source. Recently, as a two-dimensional semiconductor device has nearly reached the physical limits of the number and size of transistors that can be integrated into one chip, three-dimensional semiconductor device technologies have been suggested as solutions to this problem. One of the three-dimensional semiconductor device technologies is stacking memory cells vertically on a substrate.

A three-dimensional non-volatile memory device may include conductive layers stacked on top of one another interleaved with insulating layers, and a vertical channel layer passing through the conductive layers and insulating layers. This structure may be helpful in increasing a number of stacked memory cells, but its high aspect ratio may result in a degradation in a performance of the memory device because of its reduced cell current. Further, its high aspect ratio may cause difficulties in controlling, for example, thickness, crystallinity, and grain size of the vertical channel layer.

SUMMARY

The present disclosure provides a method for manufacturing a semiconductor device in a simple and reliable manner.

In accordance with an embodiment of the present disclosure, a method of manufacturing a semiconductor device may include forming an opening passing-through a multi-layer stack, forming a channel layer on and along a sidewall of the opening, forming a conductive layer on and along a sidewall of the channel layer, and applying a laser to the conductive layer to transfer a heat from the conductive layer to the channel layer to heat-treat the channel layer using the heat.

In accordance with an embodiment of the present disclosure, a method of manufacturing a semiconductor device may include forming a polysilicon layer, forming a conductive layer on the poly silicon layer, and applying a laser to the conductive layer to generate a heat in the conductive layer. The generated heat may be transferred to the poly silicon layer.

In accordance with an embodiment of the present disclosure, a method of manufacturing a semiconductor device may include forming a transistor over a substrate, forming a target layer over the substrate, forming a conductive layer on the target layer, and applying a laser selectively to the conductive layer to transfer a heat from the conductive layer to the target layer to heat-treat the target layer using the heat.

BRIEF DESCRIPTION OF THE DRAWINGS

A brief description of each drawing is provided to more fully understand the drawings, which is incorporated in the detailed description of the disclosure.

DETAILED DESCRIPTIONS

Figure 1:
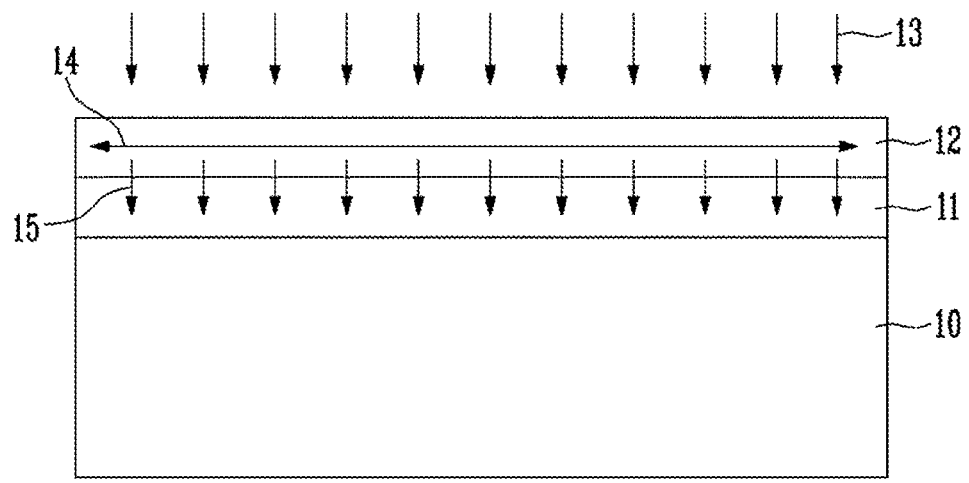
FIG. 1 illustrates a cross-sectional view for describing an example method of manufacturing a semiconductor device in accordance with an embodiment of the present disclosure.

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, s, operations, elements, and/or components, but do not preclude the presence or addition of one or more other features, integers, s, operations, elements, components, and/or groups thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings, where thicknesses of layers and/or spaces therebetween may be presented for the sake of convenience of illustration, and, thus, may be exaggerated compared to actual thickness and/or spaces. In the following descriptions, well-known structures to the art may be skipped in order not to obscure the present disclosure. When designating reference numerals for components in the drawings, it may be intended that like reference numbers may refer to like components throughout the drawings.

FIG. 1 illustrates a cross-sectional view for describing an example method of manufacturing a semiconductor device in accordance with an embodiment of the present disclosure.

Referring to FIG. 1, a target layer 11 and a conductive layer 12 may be sequentially formed on a substrate 10. For example, the target layer 11 is formed over the substrate 10, and then the conductive layer 12 is formed over the target layer 11. Thereafter, a laser 13 may be applied to the conductive layer 12 to transfer a heat 15 to the target layer 11.

Examples of the target layer 11 may include a layer having properties that may be changed by the heat transferred thereto. The target layer 11 may include a semiconductor layer. More specifically, the target layer 11 may act as a channel layer for a memory cell, a select transistor, a transistor of a peripheral circuit, or the like. For example, the target layer 11 may include at least one of silicon Si, silicon germanium SiGe, and germanium Ge. Further, when the target layer 11 includes a silicon layer, the silicon layer may include a single-crystal silicon layer, an amorphous silicon layer, a polysilicon layer or the like. It may be noted that, when the target layer 11 includes a channel layer, a gate insulating layer (not illustrated) may be interposed between the target layer 11 and the substrate 10.

Since the conductive layer 12 is electrically and/or thermally conductive, the conductive layer 12 may include tungsten W, titanium nitride TiN, aluminum Al or the like. In addition, the conductive layer 12 may include a conductive material to easily be stripped away later. Laser absorption of the conductive layer 12 may increase in a proportional manner with a thickness thereof unless the conductive layer 12 reaches a certain thickness. That is, if the conductive layer 12 has the certain thickness, the laser absorption of the conductive layer 12 may not further increase. Therefore, the thickness of the conductive layer 12 may be set in consideration of a laser reflection and absorption thereof based on a laser wavelength.

Upon the application of the laser 13 to the conductive layer 12, a heat 15 may be transferred from the conductive layer 12 to the target layer 11. This heat may be generated via free-carrier vibrations in the conductive layer 12 receiving the laser. Thus, the heat transfer to the target layer 11 may be an indirect heat transfer. In other words, a heating source (e.g., the laser) may not be directly applied to the target layer 11, but may be directly to the conductive layer 12 coupled to the target layer 11. This indirect heat transfer may increase crystallinity and/or a grain size of the target layer 11.

For example, when the laser with a larger wavelength is directly applied to the target layer 11 including a polysilicon layer, a crystallinity of the polysilicon layer may improve. However, since the polysilicon layer may rapidly melt and cool due to a nature of the laser, there may be a lack of time for a grain to grow, and multiple grain seeds may be created when the polysilicon layer is melting. Therefore, a grain size may decrease. To the contrary, when the laser with a smaller wavelength is directly applied to the target layer 11 including the polysilicon layer, the polysilicon layer may melt and/or agglomerate, thereby resulting in a profile change such as a pattern discontinuity or the like.

In accordance with an embodiment of the present disclosure, the target layer 11 may receive heat indirectly from the conductive layer 12, and may slowly melt and cool. Further, due to a covering effect by the conductive layer 12, the target layer 11 may slowly cool. In this way, a grain size of the target layer 11 may increase. Further, since the conductive layer 12 may act as a mold for the target layer 11, a shape of the target layer 11 may remain unchanged. Thus, a profile change of the target layer 11, such as an agglomeration, may be minimized.

Further, due to a good thermal conductivity of the conductive layer 12, when the laser 13 is applied to a portion of the conductive layer 12, the heat generated in the portion may spread (e.g., 14 of FIG. 1) across an entire region of the conductive layer 12. Thus, the heat may be uniformly transferred (e.g., 15 of FIG. 1) throughout the entire target layer 11.

The laser applied to the conductive layer 12 may have a wavelength that may be absorbed into the conductive layer 12. For example, the wavelength may be above 10 nm. When employing a long wavelength above 10 nm, the laser of the wavelength may cause free-carrier vibrations in the conductive layer 12 to transfer effectively the heat to the target layer 11. When employing a wavelength below 10 nm, the laser may not be absorbed into the conductive layer 12 but may reflect therefrom, and thus a heat may not be transferred to the target layer 11.

In accordance with the above manufacturing method, the conductive layer 12 may be formed selectively on the target layer 11, and then the laser may be applied selectively to the conductive layer 12. In this way, only a desired region of the memory device, that is, the target layer 11 may be heat-treated by the heat transferred thereto. In other words, unlike a hot furnace heat treatment which heat-treats not only the selected region but also other elements, the heat treatment in accordance with an embodiment may not heat-treat other elements, for example, element adjacent to a selected region, and hence may reduce an undesirable degradation caused by the heat treatment.

Figure 2:
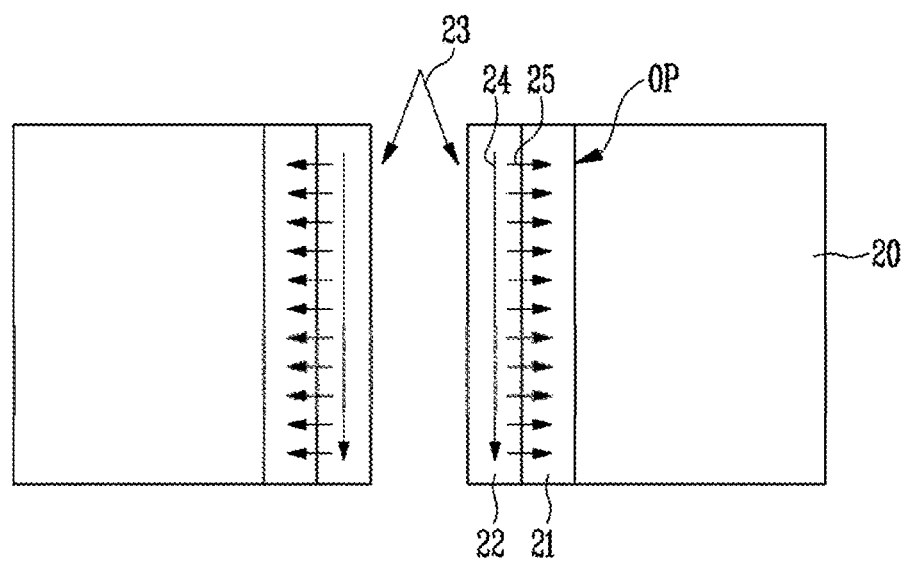
FIG. 2 illustrates a cross-sectional view for describing an example method of manufacturing a semiconductor device in accordance with an embodiment of the present disclosure.

FIG. 2 illustrates a cross-sectional view for describing an example method of manufacturing a semiconductor device in accordance with an embodiment of the present disclosure. Hereinafter, any repetitive detailed description will be omitted or simplified in order to avoid complication.

Referring to FIG. 2, an opening OP passing through a multi-layer stack 20 may be formed, and then a target layer 21 and a conductive layer 22 may be formed in the opening OP. In an embodiment, there may be a region of the opening OP that is left unfilled. Thereafter, through the non-filled region of the opening OP, a laser may be applied to the conductive layer 22.

The stack 20 may include a plurality of layers that are stacked. A sum of thicknesses of the target layer 21 and conductive layer 22 may be set to leave the non-filled region of the opening OP, that is, to form a hollow structure. Further, the thicknesses of the target layer 21 and conductive layer 22 may be substantially uniform along the sidewall of the opening OP. Alternatively, the target layer 21 and conductive layer 22 may taper downward.

When the laser is directly applied to the target layer 21 formed along the sidewall of the opening OP, it is difficult to deliver the laser to a bottom portion of the target layer 21 due to a high aspect ratio of the target layer 21. Thus, it is difficult to distribute heat uniformly across the target layer 21. In contrast, in accordance with an embodiment of the present disclosure, where the laser may be applied to the conductive layer 22 with a good thermal conductivity, even if the laser is applied 23 only to an upper portion thereof due to a high aspect ratio of the conductive layer 22, a heat may be transferred 24 entirely across the conductive layer 22, and thus the heat may be transferred to a bottom portion thereof. Therefore, via the conductive layer 22, the heat may be uniformly and entirely transferred 25 to the target layer 21.

Figure 3A:
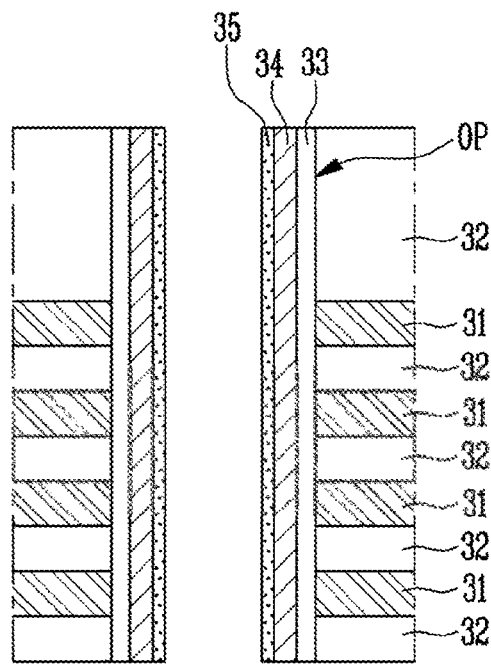
FIG. 3A to 3C illustrate cross-sectional views for describing an example method of manufacturing a semiconductor device in accordance with an embodiment of the present disclosure.
Figure 3B:
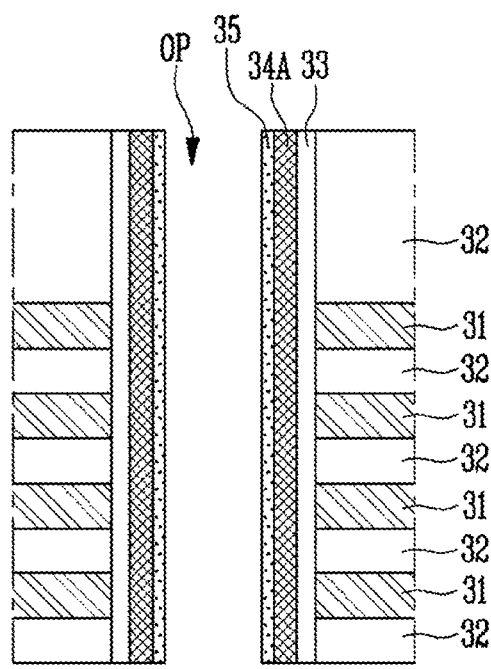
Figure 3C:
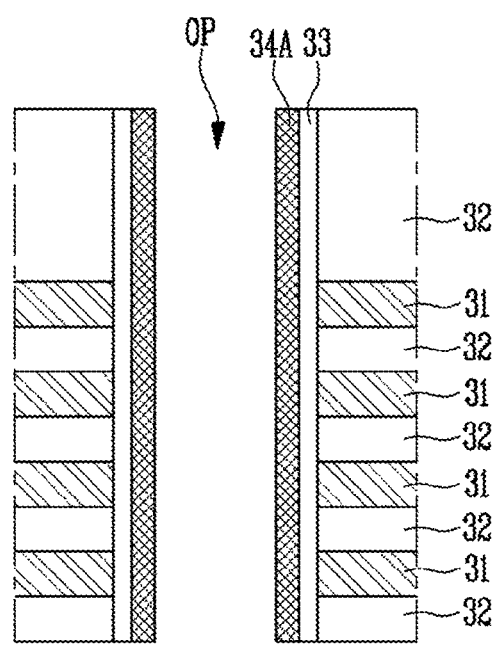

FIGS. 3A to 3C illustrate cross-sectional for describing an example method of manufacturing a semiconductor device in accordance with an embodiment of the present disclosure. Hereinafter, overlapping portions with the above descriptions may be omitted.

Referring to FIG. 3A, a multi-layer stack may be formed by alternately staking first material layers 31 and second material layers 32. Each of the first material layers 31 may be made of a material with a higher etching selectivity than a material of the second material layers 32. For example, each of the first material layers 31 may include a sacrificial layer made of a nitride or the like, while each of the second material layers 32 may include an insulating layer made of an oxide or the like. Alternatively, each of the first material layers 31 may include a conductive layer made of polysilicon or the like, while each of the second material layers may include an insulating layer made of an oxide or the like. As a further alternative, each of the first material layers 31 may include a conductive layer containing a dopant, while each of the second material layers 32 may include a sacrificial layer free of a dopant. As a still further alternative, each of the first material layers 31 may include a first sacrificial layer made of a nitride or the like, while each of the second material layers 32 may include a second sacrificial layer made of an oxide or the like. As a still further alternative, each of the first material layers 31 may include a semiconductor layer made of polysilicon or the like, while each of the second material layers 32 may include an insulating layer made of an oxide or the like.

Thereafter, an opening OP passing through the multi-layer stack of the first material layers 31 and second material layers 32 may be formed. The opening OP may have a cross-section shape including a circular, elliptical, rectangular, polygonal, or the like. A plurality of openings OP may be formed.

Thereafter, a memory layer 33, a channel layer and a conductive layer 35 may be sequentially formed in the opening OP. The memory layer 33 may include at least one of a charge blocking layer, a data storage layer, and a tunnel insulating layer. The data storage layer may include silicon, nitride, phase-transformation material, nano-dot, or the like. The channel layer 34 may include a silicon layer, and the conductive layer 35 may include a metal layer. According to an embodiment, the formation of the memory layer 33 may be omitted.

Referring FIG. 3B, through an unfilled region of the opening OP, a laser may be applied to the conductive layer 35. The applied laser may cause free-carrier vibrations in the conductive layer 35 to generate a heat, which may be transferred to the channel layer 34. In this way, the channel layer 34 may be subjected to an indirect heat treatment, which may increase crystallinity and/or grain size of a channel layer 34A.

Referring to FIG. 3C, the conductive layer 35 may be removed to expose the channel layer 34A. Thereafter, although not illustrated, a gap-filling insulating layer may be formed in the opening OP. Further, when each of the first material layers 31 is a sacrificial layer, each of the first material layers 31 may be replaced with a conductive layer. Alternatively, when each of the first material layers 32 is a conductive layer made of silicon, each of the first material layers 31 may be silicided.

In accordance with the above manufacturing method, a cell array including a three-dimensional-multi-layer stack of memory cells may be formed. Further, the channel layer 34A may be thermally treated in an indirect and selective manner, thereby improving the channel layer quality. In particular, this may make it possible to obtain uniform quality across the channel layer in spite of a higher aspect ratio of the channel layer 34A, resulting in enhanced cell current efficiencies.

Figure 4A:
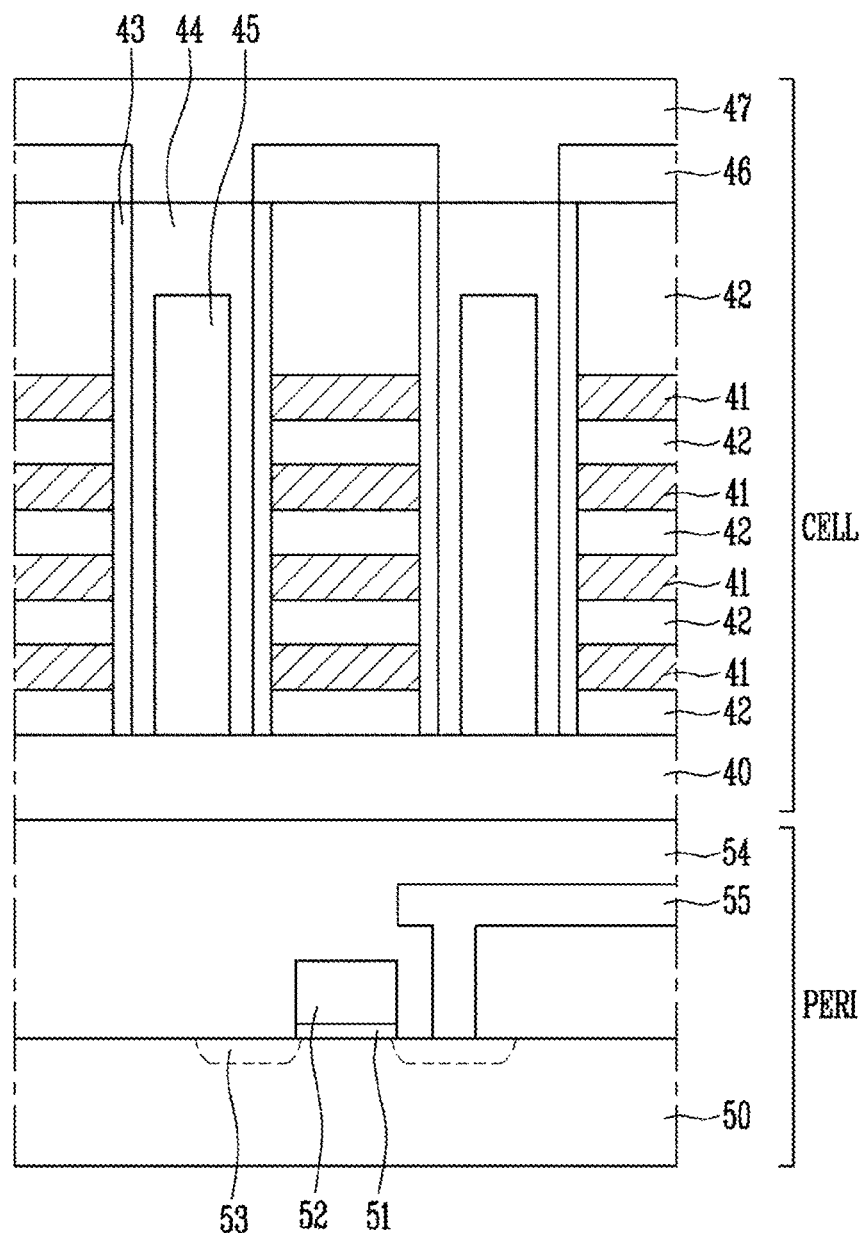
FIG. 4A and FIG. 4B illustrate cross-sectional views of examples of semiconductor devices formed in accordance with an embodiment of the present disclosure.
Figure 4B:
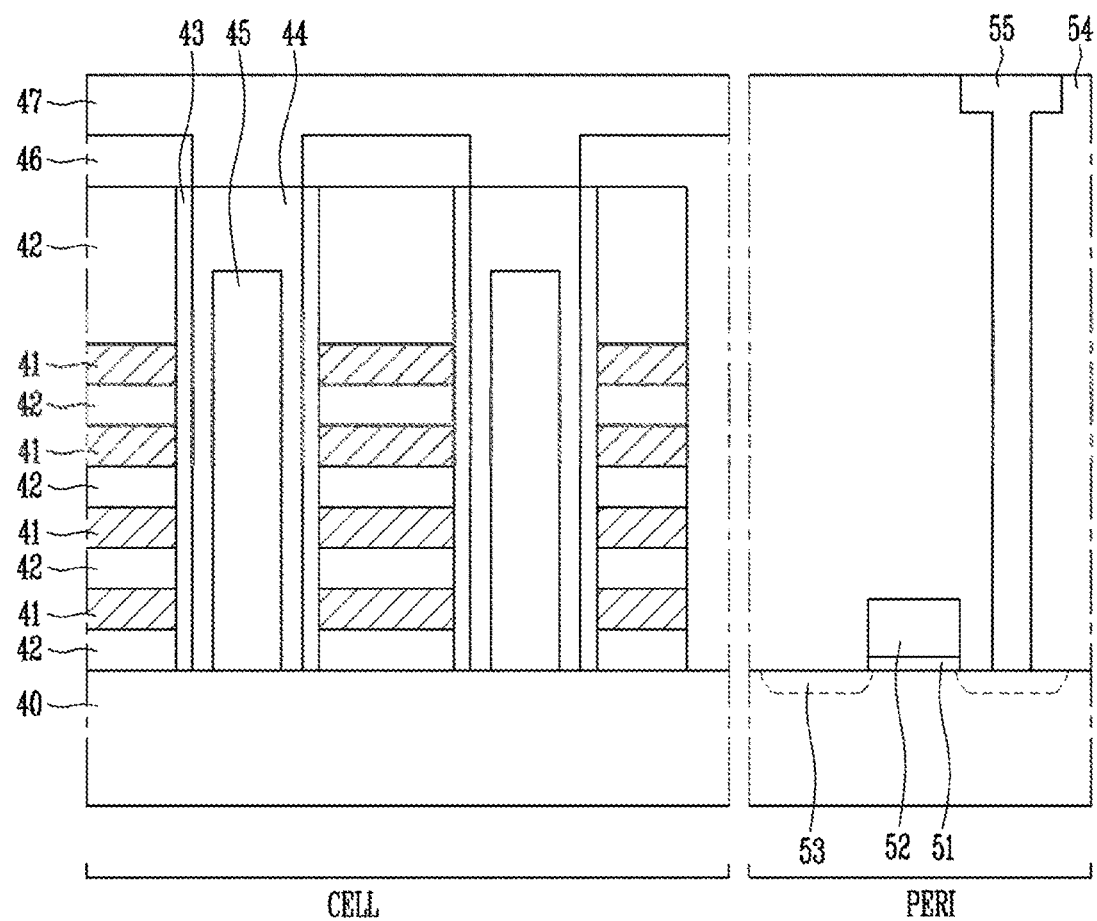

FIG. 4A and FIG. 4B illustrate cross-sectional views of examples of semiconductor devices formed in accordance with an embodiment of the present disclosure.

Referring to FIG. 4A, the semiconductor device may include a cell region CELL and a peripheral region PERI. In the cell region CELL, a cell array including a three-dimensional-multi-layer stack of memory cells may be located. In the peripheral region PERI, a driver circuit for the cell array may be located.

In the cell region CELL, conductive layers 41 and insulating layers 42 may be alternately stacked on a substrate 40. A channel layer 44 passing-through the multi-layer stack may be formed, and a memory layer 43 may be disposed between the channel layer 44 and the conductive layers 41.

The memory layer 43 may surround a sidewall of the channel layer 44. The memory layer 43 may have a C-shape surrounding each of the conductive layers 41. Each of the channel layers 44 may have a hollow structure having an opened region. The opened region may be filled with a gap-filling insulating layer 45 as illustrated in FIG. 4A. Further, an inter-layer insulating layer 46 may be disposed over the resulting structure. A wire 47 coupled to the channel layers 44, for example, a bit-line may be disposed over the inter-layer insulating layer 46.

The peripheral region PERI may be disposed below the cell region CELL. In the peripheral region PERI, there may be located a transistor including a gate insulating layer 51, a gate electrode 52, and a junction 53 on the substrate 50. Further, an inter-layer insulating layer 54 may be formed over the transistor. In the inter-layer insulating layer 54, a wire 55 coupled to the junction 53 may be disposed.

Referring to FIG. 4B, the semiconductor device may include a cell region CELL and a peripheral region PERI. In the cell region CELL, a cell array including a three-dimensional-multi-layer stack of memory cells may be located. In the peripheral region PERI, a driver circuit for the cell array may be located. The cell region CELL and the peripheral region PERI may be disposed on a single substrate 40. Configurations may be substantially identical to the configuration discussed above with reference to FIG. 4A except that the cell region CELL and the peripheral region PERI may be disposed on a single substrate 40.

When the cell array may be formed in the cell region CELL after forming the transistor in peripheral region PERI, during a heat treatment for forming the channel layer 44, already-formed transistors may be subjected to the heat treatment, thereby resulting in performance degradation such as a change in a threshold voltage of the transistor or the like. However, in accordance with an embodiment of the present disclosure, after forming the conductive layer on the channel layer 44, a laser may be applied selectively to the conductive layer for an indirect heat treatment. Thus, the heat treatment may be applied only to the channel layer 44 without the heat treatment of the transistor in the peripheral region PERI, and hence a probability of the performance degradation may decrease.

It may be noted that, although a vertical straight type memory string is illustrated, examples of the memory string may include various types of memory strings, for example, a U-type or W-type memory string.

Figure 5:
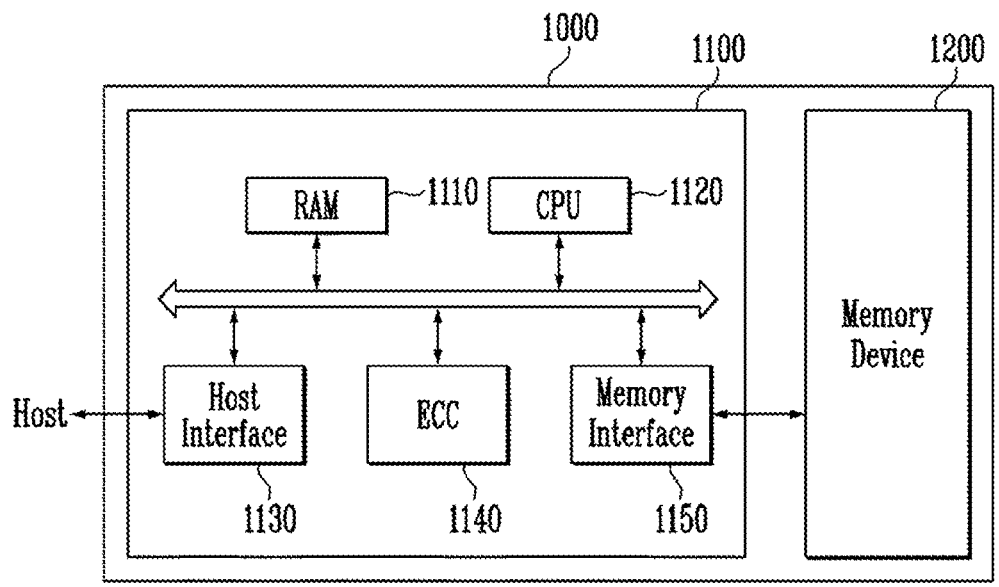
FIG. 5 and FIG. 6 are diagrams illustrating examples of memory systems in accordance with an embodiment of the present disclosure.

FIG. 5 is a diagram illustrating an example of a memory system in accordance with an implementation of the present disclosure.

Referring to FIG. 5, a memory system 1000 in accordance with an implementation of the present disclosure may include memory device 1200 and controller 1100.

The memory device 1200 may be used to store information such as a text, graphic, software code, etc. Examples of the memory device 1200 may include a nonvolatile memory, and may include the configurations discussed in connection to FIG. 1 to FIG. 4B. Further, the memory device 1200 may be manufactured using a method including forming an opening passing-through a multi-layer stack, forming a channel layer on and along a sidewall of the opening, forming a conductive layer on and along a sidewall of the channel layer, and applying a laser to the conductive layer to transfer a heat from the conductive layer to the channel layer to heat-treat the channel layer using the heat. The memory device 1200 may have the same confirmation and manufacturing method thereof as those discussed above.

The controller 1100 may be coupled to a host and the memory device 1200, and may access the memory device 1200 in a response to a request from the host. For example, the controller 1100 may control reading, writing, erasing, background operations or the like of the memory device 1200.

The controller 1100 may include a Random Access Memory (RAM) 1110, a Central Processing Unit (CPU) 1120, a host interface 1130, an Error Correction Code (ECC) Circuit 1140, memory interface 1150 or the like.

The RAM 1110 may be employed as a work memory for the CPU 1120, a cache memory between the memory device 1200 and host, and a buffer memory between the memory device 1200 and host. The RAM 1110 may be replaced with Static Random Access Memory (SRAM), Read Only Memory (ROM), etc.

The CPU 1120 may control all of operations of the controller 1100. In an example, the CPU 1120 may operate firmware such as Flash Translation Layer (FTL) stored in the RAM 1110.

The host interface 1130 may interface with the host. In one example, the controller 1100 may communicate with the host over at least one of various interface protocols such as Universal Serial Bus (USB) protocol, Multi-Media Card (MMC) protocol, Peripheral Component Interconnection (PCI) protocol, PCI-Express (PCI-E) protocol, Advanced Technology Attachment (ATA) protocol, Serial-ATA protocol, Parallel-ATA protocol, Small Computer Small Interface (SCSI) protocol, Enhanced Small Disk Interface (ESDI) protocol, and Integrated Drive Electronics (IDE) protocol, private protocol, or the like.

The error correction code block 1140 may detect and correct errors in data received from the semiconductor memory device 1200 using an error correction code ECC.

The memory interface 1150 may interface with the semiconductor memory device 1200. For example, the memory interface 1150 may include a NAND interface and/or NOR interface.

The controller 1100 may further include a buffer memory (not illustrated) to temporarily store data. The buffer memory may temporarily store data to be sent to an external device via the host interface 1130, or may temporarily store data to be sent from the memory device 120 via the memory interface 1150. Further, the controller 1100 of the memory system according to an embodiment of the present disclosure may further include a ROM (not illustrated) to store code data to interface with the host system or host.

The memory system 1000 in accordance with an implementation of the present disclosure may include the memory device 1200 with improved characteristics in terms of cell current, which may improve performance of the memory system 1000.

Figure 6:
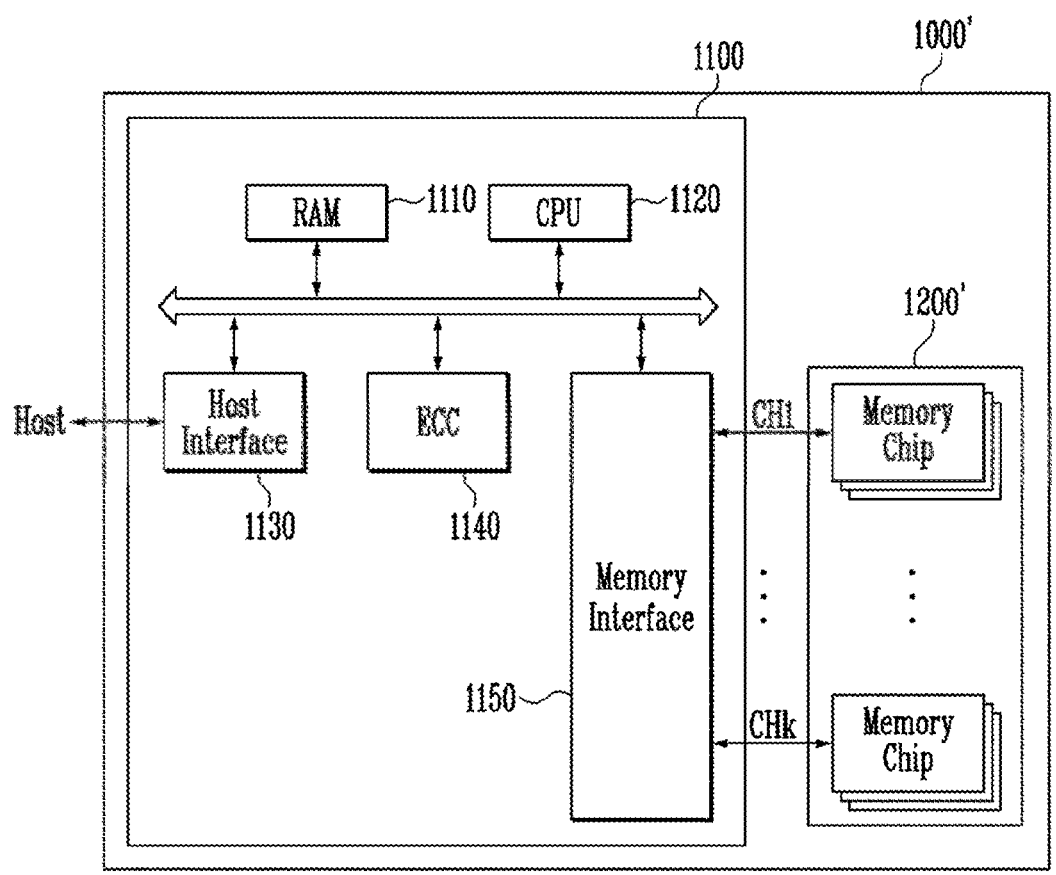

FIG. 6 is a diagram illustrating an example of a memory system in accordance with an implementation of the present disclosure. Hereinafter, any repetitive detailed description will be omitted or simplified in order to avoid complication.

As illustrated in FIG. 6, the memory system 1000' in accordance with an implementation of the present disclosure may include a memory device 1200' and controller 1100. Further, the controller 1100 may include a RAM 1110, CPU 1120, host interface 1130, ECC circuit 1140, memory interface 1150 or the like.

The memory device 1200' may be used to store information such as a text, graphic, software code, etc. Examples of the memory device 1200' may include a nonvolatile memory, and may include the configurations discussed above in connection to FIG. 1 to FIG. 4b. Further, the memory device 1200' may be manufactured using a method including forming an opening passing-through a multi-layer stack, forming a channel layer on and along a sidewall of the opening, forming a conductive layer on and along a sidewall of the channel layer, and applying a laser to the conductive layer to transfer a heat from the conductive layer to the channel layer to heat-treat the channel layer using the heat. The memory device 1200' may have the same confirmation and manufacturing method thereof as those discussed above.

Further, the memory device 1200' may be implemented in a multi-chip package composed of a plurality of memory chips. The plurality of memory chips may be divided into a plurality of groups. The plurality of groups may communicate with the controller 1100 via first to $k^{th}$ channels CH1 to CHk. The plurality of memory chips of a certain group may communicate with the controller 1100 via a common channel. Alternatively, the plurality of memory chips of the certain group may communicate with the controller 1100 via a plurality of channels, respectively.

The memory system 1000' in accordance with an implementation of the present disclosure may include the memory device 1200' with improved characteristics in terms of cell current, which may improve performance of the memory system 1000'. The multi-chip package configuration of the memory device 1200' may allow the memory system 1000' to have an increased data storage capacity and a higher operation rate.

Figure 7:
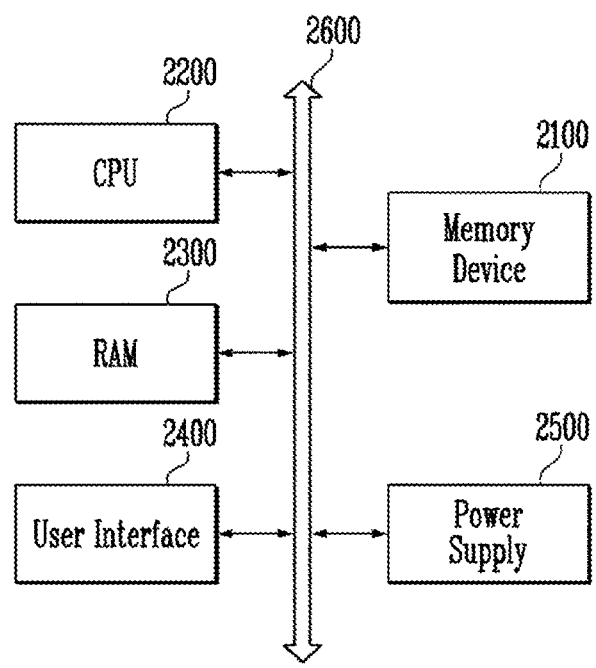
FIG. 7 and FIG. 8 are diagrams illustrating examples of computing systems in accordance with an embodiment of the present disclosure.

FIG. 7 is a diagram illustrating an example of a computing system in accordance with an implementation of the present disclosure. Hereinafter, any repetitive detailed description will be omitted or simplified in order to avoid complication.

Referring to FIG. 7, a computing system 2000 in accordance with an implementation of the present disclosure may include a memory device 2100, CPU 2200, RAM 2300, user interface 2400, power-supply 2500, system bus 2600 or the like.

The memory device 2100 may store data provided via the user interface 2400, and/or data processed by the CPU 2200. Further, the memory device 2100 may be electrically coupled, via the system bus 2600, to the CPU 2200, RAM 2300, user interface 2400, power-supply 2500, etc. In an example, the memory device 2100 may be coupled via the controller (not illustrated in FIG. 7) to the system bus 2600, or may be directly connected to the system bus 2600. When the memory device 2100 is directly connected to the system bus 2600, the function of the controller may be carried out by the CPU 2200 and RAM 2300.

Examples of the memory device 2100 may include a nonvolatile memory, and may include the configurations discussed above in connection to FIG. 1 to FIG. 4B. Further, the memory device 2100 may be manufactured using a method including forming an opening passing-through a multi-layer stack, forming a channel layer on and along a sidewall of the opening, forming a conductive layer on and along a sidewall of the channel layer, and applying a laser to the conductive layer to transfer a heat from the conductive layer to the channel layer to heat-treat the channel layer using the heat. The memory device 2100 may have the same confirmation and manufacturing method thereof as those discussed above.

Further, the memory device 2100 may be implemented in a multi-chip package composed of a plurality of memory chips as in FIG. 6.

In an embodiment, the computing system 2000 may include a computer, Ultra Mobile PC (UMPC), workstation, net-book, Personal Digital Assistants (PDA), portable computer, web tablet, wireless phone, mobile phone, smart phone, e-book, portable multimedia player (PMP), portable game player, navigation device, black box, digital camera, three-dimensional television, digital audio recorder, digital audio player, digital picture recorder, digital picture player, digital video recorder, digital video player, a device with a wireless data communication, at least one electronic device as a home networking component, at least one electronic device as a computer networking component, at least one electronic device as a telematics networking component, a RIFD device, or the like.

The computing system 2000 in accordance with an implementation of the present disclosure may include the memory device 2100 with improved characteristics in terms of cell current, which may improve performance of the computing system 2000. The multi-chip package configuration of the memory device 2100 may allow the computing system 2000 to have an increased data storage capacity and a higher operation rate.

Figure 8:
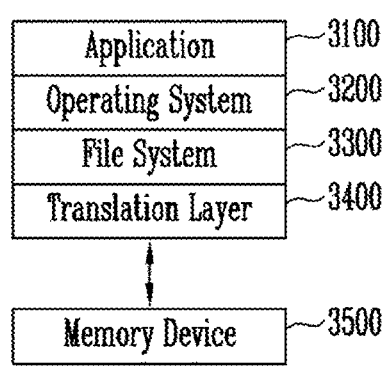

FIG. 8 is a diagram illustrating an example of a computing system in accordance with an implementation of the present disclosure.

Referring to FIG. 8, a computing system 3000 in accordance with an implementation of the present disclosure may include a software layer such as an operating system 3200, application 3100, file system 3300, a translation layer 3400 or the like. Further, the computing system 3000 may include a hardware layer such as a memory device 3500, etc.

The operating system 3200 may manage software and/or hardware resources or the like of the computing system 3000 and may control a program execution via the CPU central processing unit. The application 3100 may be implemented in various application programs executed in the computing system 3000, including utilities executed by the operating system 3200.

Example of the file system 3300 may include a logical structure that manages data, file or the like of the computing system 3000 and may organize file or data to be stored in the memory device 3500 based on rules. The file system 3300 may be determined depending on the operating system 3200 running on the computing system 3000. In an example, when the operating system 3200 is implemented in Windows series by Microsoft corporation, the file system 3300 may include FAT File Allocation Table, NTFS NT file system, etc. Alternatively, when the operating system 3200 is implemented in Unix/Linux series, the file system 3300 may include an EXT extended file system, UFS Unix File System, JFS Journaling File System, etc.

Although the operating system 3200, application 3100 and file system 3300 are illustrated as being separate from one another, the application 3100 and file system 3300 may be incorporated in the operating system 3200.

The translation layer 3400 may translate an address into a format complying with the memory device 3500 in response to a request from the file system 3300. In an example, the translation layer 3400 may translate a logical address generated from the file system 3300 to a physical address of the memory device 3500. In this connection, mapping information between the logical address and physical address may be stored in an address translation table. In an example, the translation layer 3400 may be implemented in a Flash Translation Layer (FTL), Universal Flash Storage Link Layer (ULL), or the like.

Examples of the memory device 3500 may include a nonvolatile memory, and may include the configurations discussed above in connection to FIG. 1 to FIG. 4B. Further, the memory device 3500 may be manufactured using a method including forming an opening passing-through a multi-layer stack, forming a channel layer on and along a sidewall of the opening, forming a conductive layer on and along a sidewall of the channel layer, and applying a laser to the conductive layer to transfer a heat from the conductive layer to the channel layer to heat-treat the channel layer using the heat. The memory device 3500 may have the same confirmation and manufacturing method thereof as those discussed above.

The computing system 3000 may be divided into an operation system layer corresponding to an upper level region and a controller layer corresponding to a lower level region. The application 3100, operating system 3200 and file system 3300 may be defined in the operating system layer, and may be associated with a work memory for the computing system 3000. Further, the translation layer 3400 may be defined in either the operating system layer or the controller layer.

The computing system 3000 in accordance with an implementation of the present disclosure may include the memory device 3500 with improved data retention and improved cell current characteristics, which may improve performance of the computing system 3000. The multi-chip package configuration of the memory device 3500 may allow the computing system 3000 to have an increased data storage capacity and a higher operation rate.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A method of manufacturing a semiconductor device, the method comprising:
    forming a channel layer having a main surface extending in a vertical direction from a surface of a substrate;
    forming a conductive layer extending in the vertical direction and contacting the main surface of the channel layer; and
    applying a laser to the conductive layer to generate a heat in the conductive layer, the generated heat being transferred to the channel layer,
    wherein the laser is applied to a portion of the conductive layer, and then the heat spreads within the conductive layer.

2. The method of claim 1, wherein the heat generated at the conductive layer by applying the laser is generated by free-carrier vibrations in the conductive layer.

3. The method of claim 1, further comprising, after applying the laser to the conductive layer, removing the conductive layer.

4. The method of claim 1, wherein the heat transferred from the conductive layer to the channel layer increases crystallinity of the channel layer.

5. The method of claim 1, wherein the heat transferred from the conductive layer to the channel layer increases a grain size of the channel layer.

6. The method of claim 1, wherein the channel layer is a polysilicon layer.

7. The method of claim 1, wherein the conductive layer contacts an entirety of the main surface of the channel layer.

8. The method of claim 1, wherein the heat spreads from the portion of the conductive layer to an entirety of the conductive layer, and then the heat is transferred uniformly to an entire face of the channel layer.

9. The method of claim 1, wherein the conductive layer includes at least one of tungsten (W), a titanium nitride (TiN), and aluminum (Al).

10. The method of claim 1, wherein the heat spread within the conductive layer is transferred to the main surface of the channel layer.

11. A method of manufacturing a semiconductor device, the method comprising:
    forming a transistor over a substrate;
    forming a channel layer having a main surface extending in a vertical direction over the substrate;
    forming a conductive layer extending in the vertical direction and contacting the main surface of the channel layer; and
    applying a laser selectively to the conductive layer to indirectly heat the channel layer,
    wherein the laser is applied to a portion of the conductive layer, and then the heat spreads within the conductive layer.

12. The method of claim 11, wherein the transistor is located in a peripheral region of the semiconductor device and the channel layer is located in a cell region of the device.

13. The method of claim 11, wherein the channel layer is a polysilicon layer.

14. The method of claim 11, wherein the heat is transferred uniformly to an entire face of the channel layer.

15. The method of claim 11, wherein the conductive layer includes at least one of tungsten (W), a titanium nitride (TiN), and aluminum (Al).

16. The method of claim 11, wherein the heat spread within the conductive layer is transferred to the main surface of the channel layer.

17. A method of manufacturing a semiconductor device, the method comprising:
    forming a target layer having a main surface extending in a vertical direction over a substrate;
    forming a conductive layer extending in the vertical direction and contacting an entirety of the main surface of the target layer; and
    applying a laser to the conductive layer to generate a heat in the conductive layer, the generated heat being transferred to the target layer,
    wherein the laser is applied to a portion of the conductive layer, and then the heat spreads from the portion of the conductive layer to an entirety of the conductive layer, and then the heat is transferred to the entirety of the main surface of the target layer.

18. The method of claim 17, wherein the target layer is a channel layer.

* * * * *